(12) United States Patent
Liao et al.

(10) Patent No.: US 12,347,748 B2
(45) Date of Patent: Jul. 1, 2025

(54) SEMICONDUCTOR DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Yi-Bo Liao, Hsinchu (TW); Chun-Yuan Chen, Hsinchu (TW); Lin-Yu Huang, Hsinchu (TW); Yi-Hsun Chiu, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 496 days.

(21) Appl. No.: 17/891,384

(22) Filed: Aug. 19, 2022

(65) Prior Publication Data

US 2024/0063093 A1    Feb. 22, 2024

(51) Int. Cl.
*H01L 23/48* (2006.01)
*H01L 21/768* (2006.01)
*H10D 30/01* (2025.01)
*H10D 30/43* (2025.01)
*H10D 30/67* (2025.01)
*H10D 62/10* (2025.01)

(52) U.S. Cl.
CPC ...... *H01L 23/481* (2013.01); *H01L 21/76898* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01)

(58) Field of Classification Search
CPC ............ H01L 23/481; H01L 21/76898; H10D 30/014; H10D 30/031; H10D 30/43; H10D 30/6735; H10D 30/6757; H10D 62/121

See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,546,787 B2 | 1/2020 | Bao et al. |

(Continued)

*Primary Examiner* — Wasiul Haider
(74) *Attorney, Agent, or Firm* — NZ Carr Law Office

(57) ABSTRACT

A semiconductor device is provided. The semiconductor device has a stack of parallel metal gates formed on a first side of a substrate, a first pair of insulation regions extending across the stack of parallel metal gates, a second pair of insulation regions replacing two of the parallel metal gates, a first isolated region enclosed by the first and second pairs of insulation layers, a first via formed within the isolated region, and an insulation layer replacing the metal gates located within the isolated region. Tree or more metal gates are located within the isolated region, and the first via extends through a portion of a center one of the three metal gates within the isolated region.

20 Claims, 18 Drawing Sheets

(56) References Cited

U.S. PATENT DOCUMENTS

| | | |
|---|---|---|
| 10,867,867 B2 | 12/2020 | Chiang et al. |
| 2016/0247728 A1* | 8/2016 | You .................... H10D 84/017 |
| 2019/0148539 A1* | 5/2019 | Yang .................. H10D 30/024 |
| | | 257/401 |
| 2020/0135576 A1 | 4/2020 | Ching et al. |
| 2020/0373400 A1 | 11/2020 | Cheng et al. |

* cited by examiner

SEMICONDUCTOR DEVICE AND METHOD OF MANUFACTURING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate. The various material layers can also be patterned using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
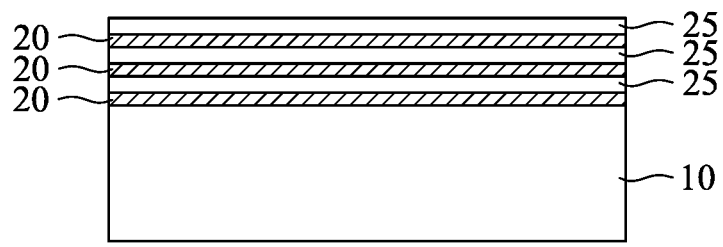
FIGS. 1 to 13 show processes for forming a semiconductor device in which a frontside part of a feed-through via is formed according to one embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, metallization of a gate all around (GAA) field-effect transistor (FET) device and a method of forming the same. Various embodiments discussed herein allow for forming a feed-through via (FTV) that is wide and short to eliminating possible high resistance and high capacitance using traditional routing which output signals from a bottom metal layer M0/M1 of a driver to top metal layer, and then go down to the bottom metal layer M0/M1 of a receiver. The feed-through via may be wide and short. The floating metal gate (MG) surrounding the feed-through via may degrade performance of the device by large coupling capacitance. Embodiments presented herein are directed to eliminate or minimize the coupling capacitance.

FIGS. 1 to 13 show exemplary sequential processes for manufacturing a front-side portion of a FTV in a semiconductor device such as a GAA transistor device in the nanoscale (nanosheet transistor) according to one embodiment of the present disclosure. It is understood that additional operations can be provided before, during, and after processes as shown in FIGS. 1 to 22, and some of the operations may be replaced with others according to specific operation requirements for manufacturing this or another device. The order of the operations and/or processes may be interchangeable.

FIG. 1 is a side view of a substrate 10, for example, a silicon (Si) substrate and stacked semiconductor layers formed on the substrate 10. Impurity ions (dopants) may be implanted into the substrate 10 to form a well region. The ion implantation is performed to prevent punch through effect. The substrate 10 may include a single-crystalline semiconductor layer on at least its surface portion. Material for forming the single-crystalline semiconductor layer may include silicon (Si), germanium (Ge), silicon germanium (SiGe), gallium arsenide (GaAs), indium antimonide (InSb), gallium phosphide (GaP), gallium antimonide (GaSb), aluminum indium arsenide (InAlAs), indium gallium arsenide (InGaAs), gallium antimony phosphide (GaSbP), gallium arsenic antimonide (GaAsSb), and indium phosphide (InP).

The stack of semiconductors layers includes, for example, first semiconductor layers 20 and second semiconductor layers 25 alternately formed on the substrate 10. The first and second semiconductor layers 20 and 25 are made of materials having different lattice constants. Material for forming the first and second semiconductors 20 and 25 may include, but is not limited to, Si, Ge, SiGe, GaAs, InSb, GaP, GaSb, InAlAs, InGaAs, GaSbP, GaAsSb, and InP. In the embodiment as shown in FIG. 1, the first semiconductor layers 20 includes Si or SiGe with a relatively small or zero Ge concentration. The second semiconductor layers 25 includes SiGe with a Ge concentration larger than that of the first semiconductor layers 20. The first semiconductor layers 20 may form channel regions of the GAA transistor device subsequently in nanoscale, while the second semiconductor layers 25 may be designated as sacrificial layers which are subsequently removed. To form a FinFET (fin field-effect transistor), the double-layer structure of 20 and 25 may be replaced with a single semiconductor layer formed on the substrate 10.

In the embodiment as shown in FIG. 1, the first semiconductor layers 20 may include Si epitaxial layers and the second semiconductor layers 25 may include SiGe epitaxial layers formed using system such as molecular-beam epitaxy (MBE) and ultra-high vacuum chemical-vapor deposition (UHV-CVD) due to their flexibility in controlling growth parameters. Other systems such as chemical vapor deposition (CVD), metal-organic (M0) CVD, low pressure (LP) CVD, plasma enhanced (PE) CVD, physical vapor deposition (PVD), atomic layer deposition (ALD), or other processes may also be used for forming the first and second semiconductor layers 20 and 25.

Figure 2:
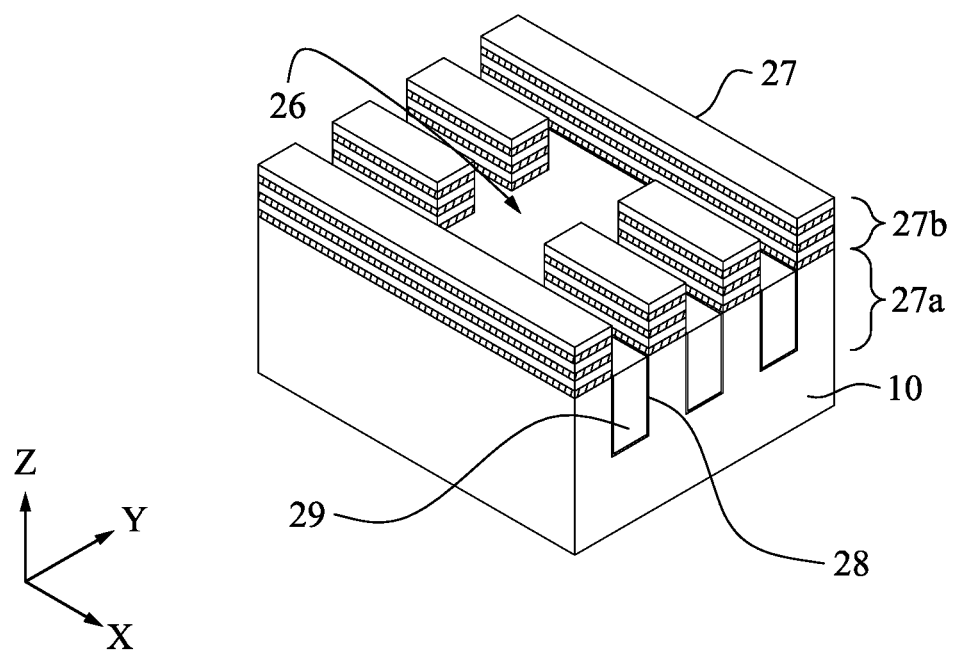

Photolithography and etching processes may be performed to pattern the stack of first and second semiconductors layers 20 and 25. In one embodiment as shown in FIG. 2, the photolithography and etching processes remove not only a portion of the stack of first and second semiconductor layers 20 and 25, but also the portion of the substrate 10 uncovered by the patterned stack of semiconductor layers 20 and 25. The photolithography and self-aligned etching processes may be a double or multi-pattern process that allows creation of patterns with pitches smaller than using a single, direct photolithography process. The first and second semiconductor layers 20 and 25 and the portion of the substrate 10 underneath the stack are patterned into a stack of fin structures 27.

In one embodiment as shown in FIG. 2, four fins 27 are formed to extend in parallel along the X-axis. Each of the fin structures 27 may include a substrate fin portion 27a and a stack fin portion 27b of the patterned first and second semiconductor layers 20 and 25. Each of the fin structures 27 may also include a well region with n-type or p-type dopants at or near the interface between the bottommost first semiconductor layer 20 and the substrate fin portion 27a. The middle two among the four fins 72 are patterned with openings for forming a recess 26 as shown in FIG. 2. The recess 26 corresponds to a cell region in which a feed-through via is to be formed. The definition of the cell region and the formation of the feed-through via will be described in details hereinwith.

A liner layer 28 is formed on the exposed surfaces of the fin structures 27 and the substrate 10. In some embodiment, an optional liner layer may be first formed, followed by the formation of the liner layer 28. The liner layer 28 may be conformal to the surface profile of the substrate 10 and the fins 27 and deposited using conformal process such as ALD process. The term "conformal" may refer to a layer having substantially uniform or the same thickness along various regions of a surface. The liner layer 28 may be formed of a semiconductor material such as Si. The liner layer 28 may also be optional.

An insulation layer 29 is formed over the substrate 10 so that the fin structures 27 are embedded in the insulation layer 29. The insulation layer 29 may include oxygen-containing material such as silicon oxide (SiO) or fluorine-doped silicate glass (FSG), nitrogen-containing material such as silicon nitride (SiN), silicon oxynitride SiON, or silicon carbon nitride (SiCN), a low-K dielectric material, or other dielectric materials. The insulation layer 29 may be formed by processes such as LPCVD, PECVD, or flowable CVD (FCVD). A planarization process such as chemical mechanical polishing (CMP) process and an etch-back process may then be performed to remove a portion of the insulation layer, such that stack fin portions 27b are exposed, while the majority part of the substrate fin portion 27a are still embedded in the remaining insulation layer 29. The remaining insulation layer 29 may be referred to as the shallow trench isolation (STI). The remaining insulation layer 29 may have a top surface level with or below a joining surface of the stack fin portion 27b and the substrate fin portion 27a. The removal process may include any suitable process such as dry etch or wet etch that selectively removes the insulation layer 29 without removing the liner 28 (if present).

Figure 3:
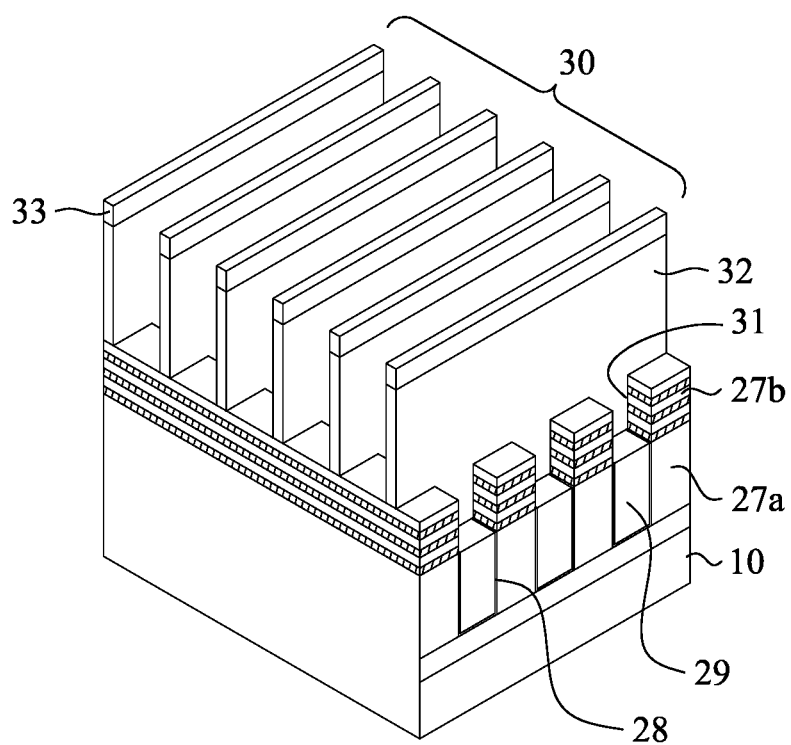

FIG. 3 is a perspective view showing formation of a stack of parallel and space-apart sacrificial gates 30 over the fin structures 27. In one embodiment, the patterned first semiconductor layers 20 in the fin structures 27a may be sacrificial layers which are subsequently partially removed, and the patterned second semiconductor layers 25 may be subsequently formed into channel layers of FET devices. Each of the stack of sacrificial gates 30 may include a sacrificial gate dielectric layer 31, a sacrificial gate electrode layer 32 over the sacrificial gate dielectric layer 31, and the mask layer 33 covering the gate electrode layer 32. The sacrificial gates 30 may be formed by sequentially depositing blanket layers of the sacrificial gate dielectric layer 31 on exposed stacked first and second semiconductor layers 20 and 25, the sacrificial gate electrode layer 32 over the sacrificial gate dielectric layer 31, and the mask layer 33 on the sacrificial gate electrode layer 32, followed by patterning and etch processes. The mask layer 33, the sacrificial gate electrode 32, and the sacrificial gate dielectric layer 31 are then patterned and etched to form into the sacrificial gates 30 as shown in FIG. 3. The sacrificial gate dielectric 31 layer may be formed of insulation material such as silicon-oxide-based material. The sacrificial gate electrode layer may be formed of polycrystalline silicon (polysilicon) or amorphous silicon. The sacrificial gate dielectric layer 31 and the sacrificial gate electrode 32 may be deposited using CVD, LPCVD, PECVD, PVD, ALD, and other suitable deposition processes.

Figure 4:
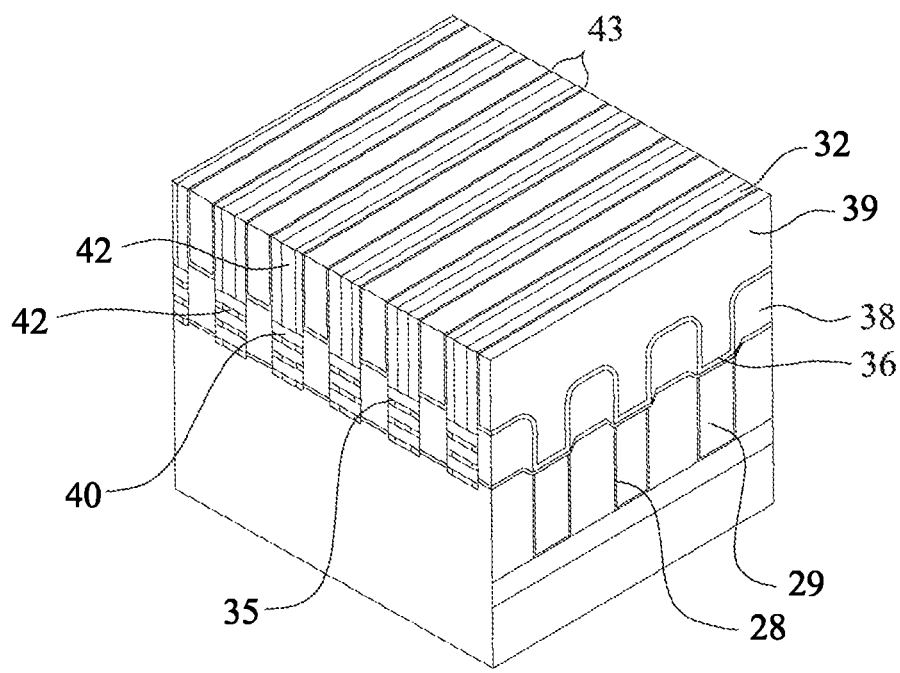

Next, gate spacers 34 are formed on sidewalls of the sacrificial gates 30 as shown in FIG. 4). The gate spacers 34 may be formed by first depositing a conformal spacer layer on the exposed surfaces of the sacrificial gates 30, and performing an anisotropic etch process (e.g., RIE) on the spacer material layer so that the spacer layer is removed from horizontal surfaces, such as the tops of the fin structures 27 and the insulation layer 29, leaving the gate spacers 34 on the vertical surfaces, such as the sidewalls of sacrificial gates 30. The gate spacers 34 may be made of a dielectric material such as silicon oxide, silicon nitride, silicon carbide, silicon oxynitride, SiCN, silicon oxycarbide, SiOCN, and/or combinations thereof.

After the stack of sacrificial gates 30 is formed, as shown in FIG. 4, the fin structures 27 uncovered by the sacrificial gates 30 are removed to define the source/drain (S/D) regions. In this disclosure, the source and drain are interchangeably used, and the structures are substantially the same. Anisotropic etching such as reactive ion etching (RIE) may be used for removing the exposed fin structures 27 until the remaining exposed fin structures 27 are below a top surface of the insulation layer 29. After the exposed fin structures 27 are removed, end portions of the first semiconductor layers 20 are horizontally etched, and a dielectric layer 35 is formed on the horizontally etched first semiconductor layers 20. The dielectric layer 35 may be made of a low-K dielectric material, such as SiON, SiCN, SiOC, SiOCN, or SiN. After the dielectric layer 35 is formed, source/drain (S/D) epitaxial layer 38 are formed. The S/D/ epitaxial layer 38 may include one or more layers of Si, SiP, SiC, and SiCP for an n-channel FET, or Si, SiGe, Ge for a p-channel FET. The S/D epitaxial layer 38 may be formed by epitaxial growth method using CVD, ALD, or MBE.

Subsequently, a contact etch stop layer (CESL) layer 36, for example, a silicon nitride-based layer such as SiN, is conformally formed on exposed surfaces of the S/D epitaxial layer 38 and the sacrificial gates 30. An interlayer dielectric layer (ILD) 39 is formed over the CESL layer 36. The ILD 39 layer may be formed of tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 39 may be deposited by a PECVD process or other suitable deposition technique. In some embodiments, after formation of the ILD layer 39, a thermal process may be performed to anneal the ILD layer 39. A planarization process such as CMP is performed to expose the sacrificial gate dielectric layer 31. The sacrificial gate structures 30, including the sacrificial gate dielectric layer 31 and the sacrificial gate electrode 32 are then removed. The ILD layer 39 may serve as a contact etch stop layer (CESL) to protect the S/D epitaxial layer 38 during removal of the sacrificial gate structures 30. The second semiconductor layers 25 are then removed, for example, using selective etchant to selectively remove the second semiconductor layers 25 against the first semiconductor layers 20. A gate dielectric layer 41 is then formed to wrap around the first semiconductor layers 20 functioning as channels 40. Gate electrodes 42 are then formed on the gate dielectric layer 41 as shown in FIG. 4. A stack of metal gates 43 each including a gate electrode 42 and a gate dielectric 41 is formed.

In one embodiment, the gate dielectric layer 41 may be formed of one or more layers of dielectric materials such as silicon oxide, silicon nitride, or high-k dielectric material, or other suitable dielectric layers. Examples of high-k dielectric material include $HfO_2$, HfSiO, HfSiON, HfTaO, HfZrO, zirconium oxide, aluminum oxide, titanium oxide, hafnium dioxideoalumina ($HfO_2$—$Al_2O_3$) alloy. The gate dielectric layer 41 may include an interfacial layer formed between the channel layers and the dielectric layer materials. Formation of the gate dielectric layers may include CVD, ALD, or deposition processes. In one embodiment, the highly conformal deposition process ALD is used to form the gate dielectric layer 41 to ensure a uniform thickness around the channels 40.

The gate electrode layer 42 formed on the gate dielectric layer 41 may include one or more layers of conductive materials such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys. The gate electrode layer 104 may be formed of CVD, ALD, electroplating, or other suitable method. Other processes, for example, formation of silicide layer and conductive contact over the S/D epitaxial layers 38 may also be performed subsequently.

Figure 5:
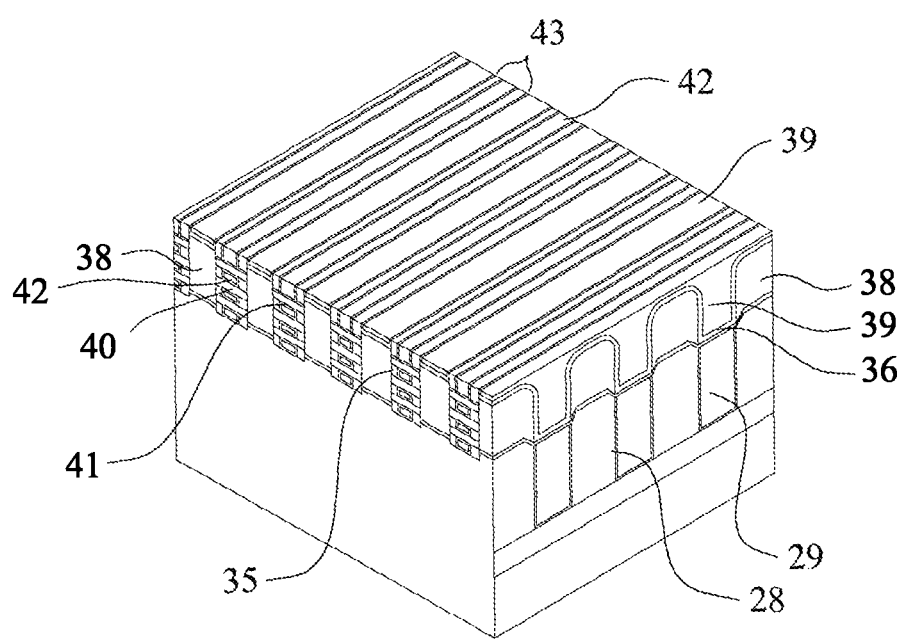

The semiconductor device as shown in FIG. 4 is thinned down for metallization. As shown in FIG. 5, the S/D region 38 is covered with a very thin portion of the ILD layer 39 after the thin-down process. The thin-down process may be performed by CMP or other suitable planarization process.

Figure 6:
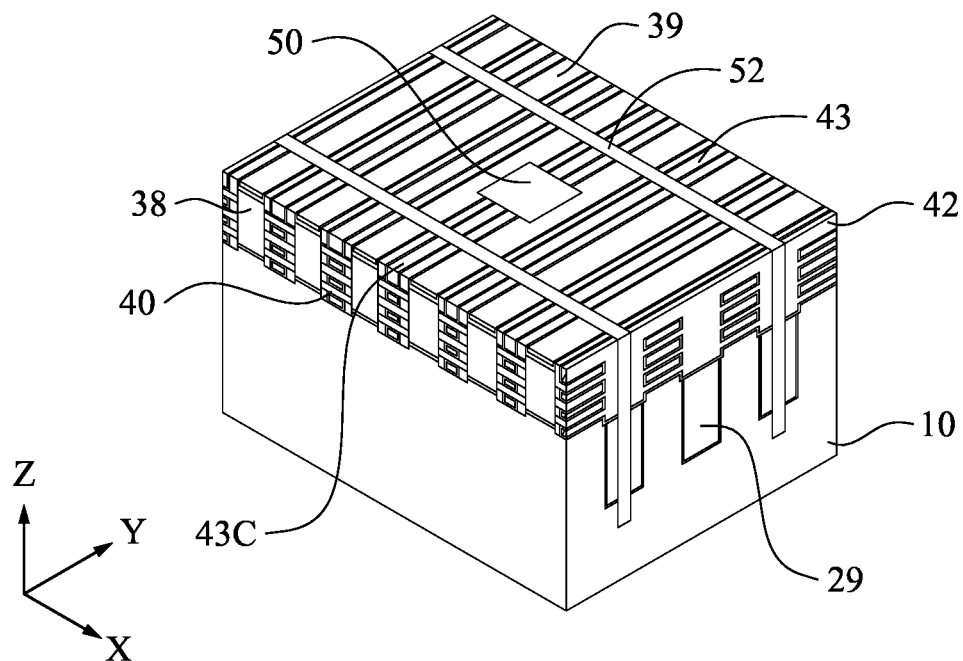

In FIG. 6, a cut metal gate (CMG) process is performed. For example, portions of each metal gate 43 along a pair of cutting lines extending across and/or perpendicular to the stack of metal gates 43 are removed (cut away) to define a first pair of insulation regions. The CMG process may include forming a mask layer over the semiconductor structure as shown in FIG. 5. The mask layer may be patterned with a pair of parallel openings and a via opening. The parallel openings extend along the pair of cutting lines across a predetermined number of the stack of metal gates 43. The via opening is located between the pair of parallel openings and is to be formed into via region 50. The via opening may expose a central portion of one of the metal gates 43 located between the parallel openings (denoted with the reference numeral 43C). The via opening may also expose a portion of the ILD layer 39 immediately abutting the exposed central portion of the metal gate 43C. The portions of the metal gates 43 and the ILD layer 39 exposed by the openings may be removed using one or more etch processes. In some embodiments, the one or more etch processes are performed to remove the metal gates 43 and the ILD layer 39 until the insulation layer 29 and the CESL 36 are exposed. The portions of metal gates 43 and ILD layer 39 exposed by the parallel openings and the via opening, the portion of the ILD layer 39 exposed by parallel openings and the via opening, and the underlying layers, including portions of the channels 40, the source/drain epitaxial layers 38, and the ILD layer 29, and a portion of the substrate 10 may be removed. Refill of insulation material is then performed for forming the via region 50 and the insulating regions 52. The refill material may include insulation materials such as SiO, SiOC, AlO, AlON, ZrO, HfO, TiO, ZrAlO, ZnO, SiOCN, SiOCN, SiCN, and other suitable insulation materials.

In one embodiment as shown in FIG. 6, the via region 50 extends through the central portion of the metal gate 43C along both the X-axis and along the Y-axis. The via region 50 extends beyond the metal gate 43C along X-axis. In other words, the via region 50 has a larger width than the metal gate 43C. Depending on the fabrication parameters and the specifications of the desired device and/or the device specifications, the via region 50 may extend through more two or more metal gates 43 and the ILD layers 39 and 49 between the two or more metal gates 43 along the X-axis, and the dimension of the via region 50 may also be changed according to the specific process and device parameters and requirements.

As the cell region 70 (see FIG. 7) is isolated between the trenches 60 and the insulation regions 52, the three metal gates 43 within the cell region 70 is electrically disconnected to the structures or devices outside of the cell region 70. That is, the metal gates 43 within the cell region 70 are in a floating state and will be referenced to as 43F hereinafter. As the via region 50 is be filled with conductive material subsequently, the floating metal gates 43F located in the proximity of a via formed at the via region 50 inevitably creates a coupling capacitance significant enough to degrade the device performance. To minimize or eliminate the coupling capacitance between the via and the neighboring floating gates 43F, the floating gates 43 within the cell region 70 are removed through CPODE process as described as follows.

Figure 7:
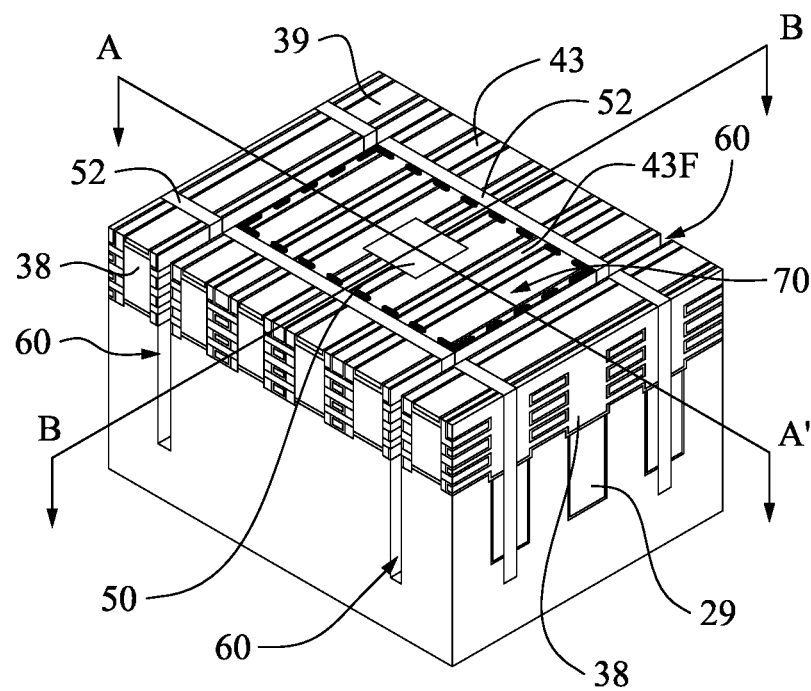

In the embodiment as shown in FIG. 7, a first CPODE process is performed to remove a pair of gate electrodes 43 for forming a pair of trenches 60. In one embodiment, three metal gates 43 are sandwiched between the trenches 60. A cell region 70 (within the dash line as shown in FIG. 7) that includes the via region 50 and three metal gates 43 is defined between the insulation regions 52 and the trenches 60 in the first CPODE process.

The semiconductor device as shown in FIG. 6 is subjected to a fin-cut (or sheet-cut) process, followed by a refill process with a dielectric layer. The fin-cut or sheet-cut process may be referred to continuous poly silicon on diffusion edge (CPODE) process. The term "diffusion edge" may be equivalent to an active edge, that is, an edge abutting adjacent to active regions. The CPODE process may be used to reduce gate pitch, thereby increasing the density for multiple gate devices and device performance required for aggressively scaled circuits and devices. In the embodiment as shown in FIG. 7, the first CPODE process is performed to remove a pair of gate electrodes 43, and to form a pair of trenches 60 to be filled with the dielectric layer. In one embodiment, three metal gates 43, including the metal gate 43 having a portion removed for defining the via region 50 and two metal gates 43 immediately adjacent the via region 50 and between the trenches 60, are included in a cell region 70 defined between the insulation regions 52 and the trenches 60 in the first CPODE process.

In some embodiments, a second CPODE process may be performed to remove the floating gates 43F within the cell region 70 defined by the insulation regions 52 and the trenches 60. The second CPODE process may include forming a mask layer over the semiconductor device. The mask layer is patterned to form three openings exposing the three floating gates 43F, including the metal gate 43 with a portion removed to form the via region 50 and the two immediately adjacent metal gates 43. The metal gates 43 exposed by the mask layer are then removed to by a removal process, such as wet etch, dry etch, or any other suitable processes. The removal process may be a selective etch process that removes the metal gates 43 and the substrate 10, but does not remove the dielectric materials, such as the insulation materials in the via region 50 and the ILD layer 39. As shown in FIG. 7, the trenches 60 are in the form of two open regions extending in parallel with the remaining metal gates 43 across and/or perpendicular to the insulation regions 52.

Figure 7A:
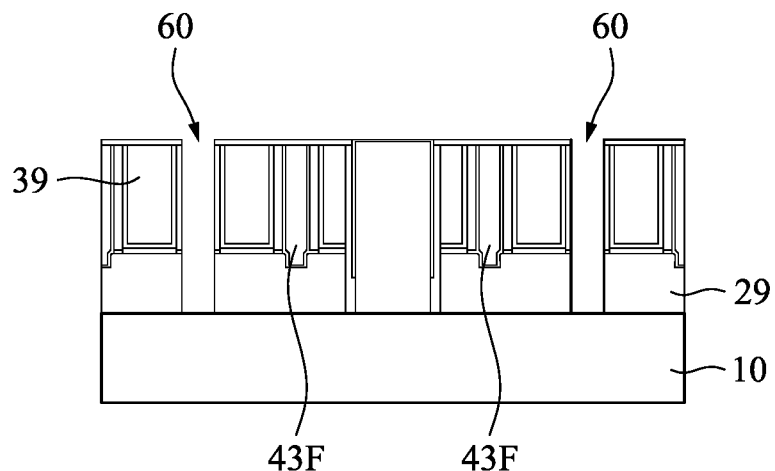
Figure 7B:
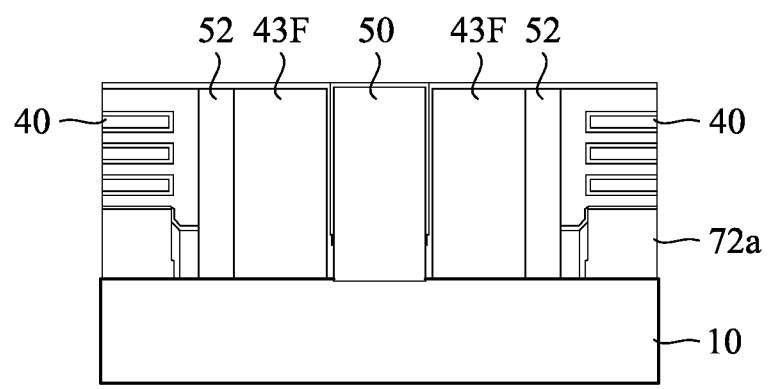

FIGS. 7A and 7B are cross-sectional views of the part enclosed within the dash box of the semiconductor device as shown in FIG. 7 along the lines A-A' and B-B', respectively. In the following descriptions, the drawing denoted with the letter "A" refers to the cross section cutting long the line A-A', while the drawing denoted with the letter "B" refers to the cross section cutting along the line B-B'. In FIG. 7A, to minimize or eliminate the coupling capacitance, the floating metal gates 43F are removed. Viewing along the direction B-B' parallel with the elongate side of the metal gates 43, in FIG. 7, the floating gate 43F across which the via region 50 is formed and the floating gate 43F at two opposite sides of the via region 50 are to be removed.

Figure 8:
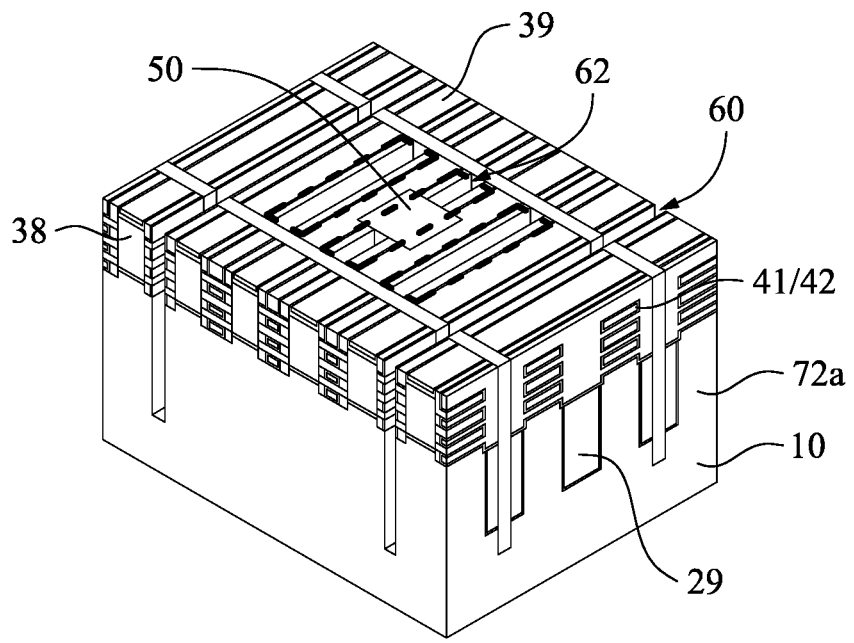
Figure 9:
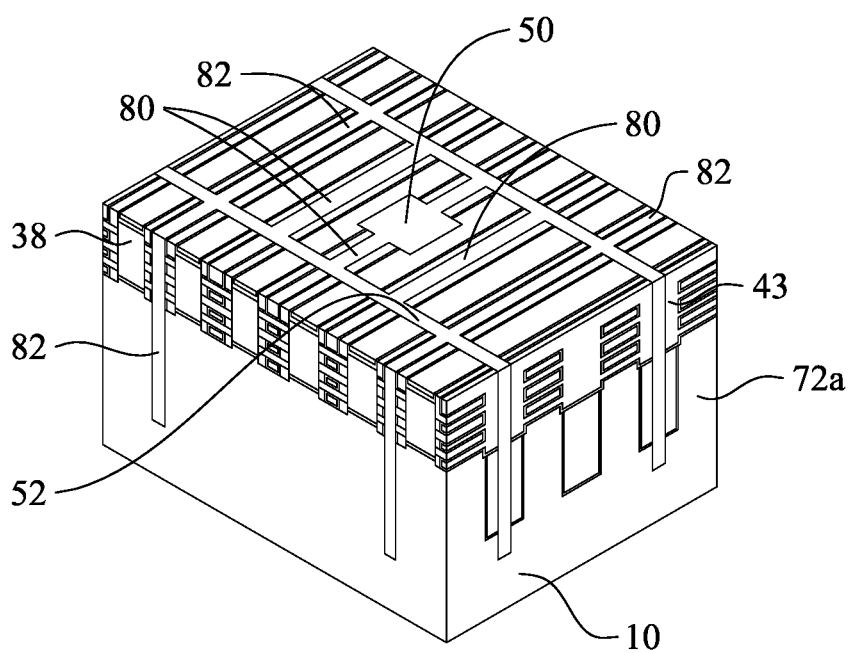

To eliminate or minimize the coupling capacitance, the floating gates 43F are removed by an additional CPODE process. The CPODE includes forming a mask layer over the semiconductor device. In one embodiment, the mask layer is patterned to form three openings to expose the floating gates 43F within the cell region 70. FIG. 8 shows the exposed float gates 43F within the dash-lines (where the openings of the masked layer are located) are removed. The mask layer is then removed. In FIG. 9, the openings 62 and the trenches 60 are re-filled with insulation materials to form the insulation layer 80 and the insulation structures 82, respectively. The refill insulation materials may include SiO, SiOC, AlO, AlON, ZrO, HfO, TiO, ZrAlO, ZnO, SiOCN, SiOCN, SiCN, and other suitable insulation materials.

Figure 10:
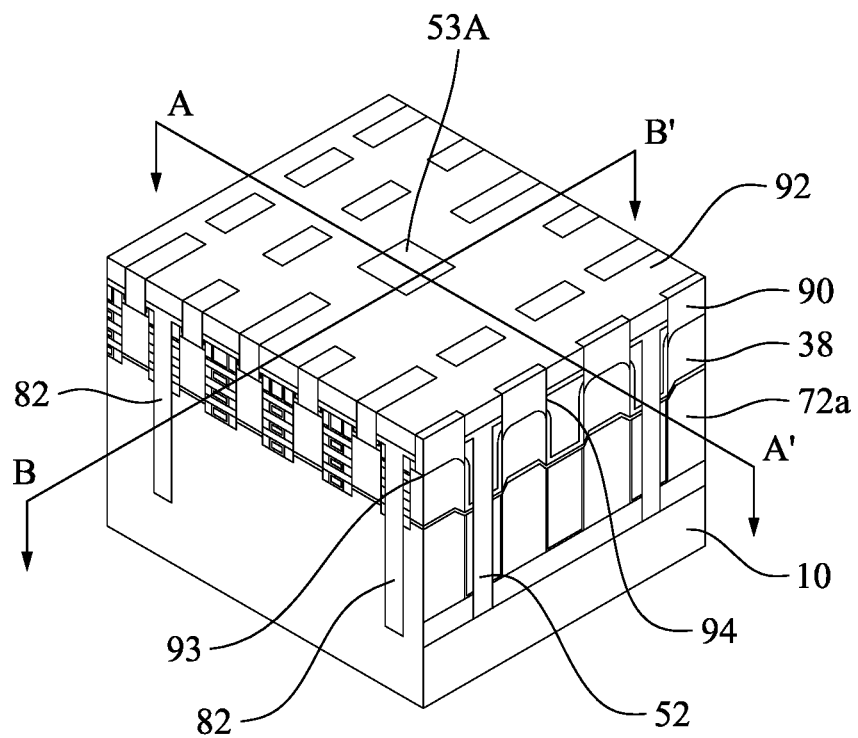

To complete formation of the frontside via, that is, the via formed at a front side of the substrate where active devices are formed, a mask layer with opening exposing the via region 50 may be formed. The insulation material in the via region 50 may be removed. A hard mask layer is formed and patterned with openings exposing the via region 50. In one embodiment as shown in FIG. 10, formation of the frontside via 53A may be performed in the same step for forming source/drain contacts. For example, the hard mask layer may be patterned with openings exposing the source/drain regions 38 (or the CESL 36 on the S/D region 38 and the via region 50 and an opening exposing the via region 50, such that a portion of the source/drain region 38 and the insulation layer within the via region 50 may be removed during the same etching step. Due to the different characteristics of the insulation material within the via region 50 and the material of the source/drain regions 38, the insulation layer may be etched to a level deeper than bottoms of the source/drain regions 38, while only a top portion of the source/drain regions 38 may be removed in the same etching step. The via region 50 exposed by the opening may be filled with conductive material to form the frontside via 53A. The materials for forming the frontside via 53A may include W, Ru, Co, Cu, Ti, TiN, Ta, TaN, Mo, Ni, and other suitable metals or metal alloys.

Figure 11A:
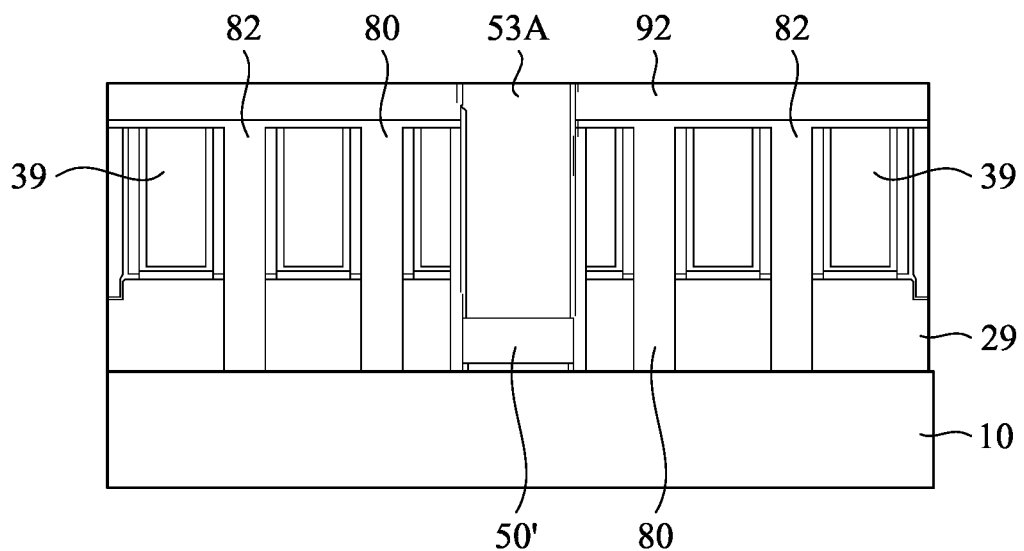
Figure 11B:
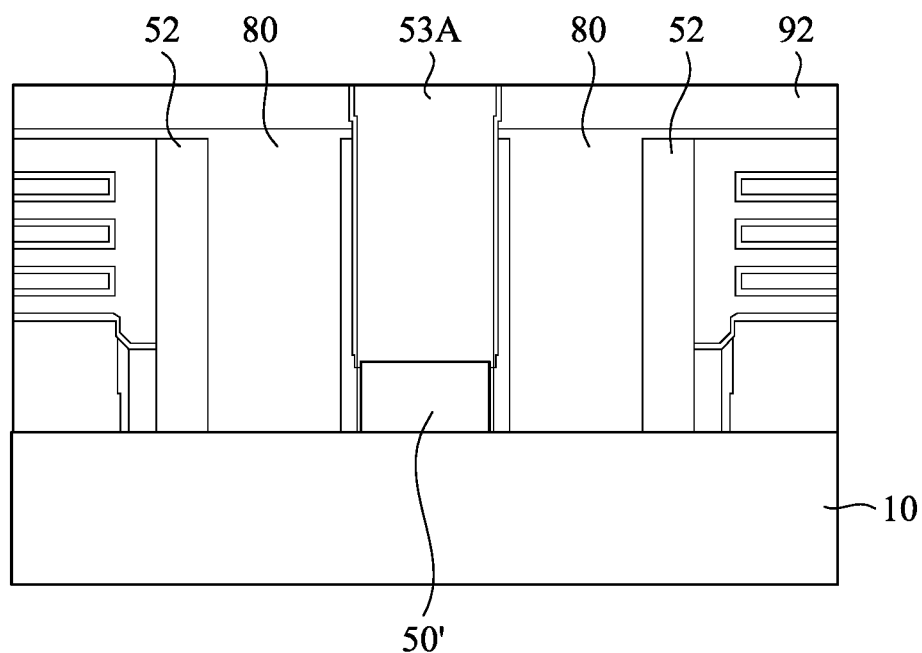

FIGS. 11A and 11B are cross-sectional views along lines A-A' and B-B' of FIG. 10. In one embodiment, the material at a top portion of the via region 50 has been removed by etching process and refilled with the conductive material to form the frontside via 53A on top of the remaining via region 50'. In some embodiments, all the material of the via region 50 may be removed such that the frontside via 53A may be formed to extend towards the bottom of the via region 50. The frontside via 53A may have a top dimension of about 30 nm to about 100 nm and a bottom dimension ranging from about 25 nm to about 90 nm. The height of the frontside via 53A may be about 20 nm to about 200 nm.

A frontside silicide layer 93 with a thickness of about 1 nm to about 50 nm may be formed on the source/drain region 38 as shown in FIG. 11. Materials used for forming the silicide may include TiSi, NiSi, RuSi, for example. A liner layer 94 conformal to the surface topography may be formed following the formation of the silicide layer 93. The liner layer 94 may have a thickness of about 1 nm to about 5 nm. Source/drain (S/D) contacts 90 is then formed within the openings that expose the source/drain regions 38. Materials such as tungsten (W), ruthenium (Ru), cobalt (Co), copper (Cu), titanium (Ti), titanium nitride (TiN), ruthenium nitride (RuN), or other suitable metal or metal alloys may be used for forming the S/D contacts 90. The S/D contacts 90 may be formed with a height of about 10 to 50 nm according to one embodiment. In one embodiment, the frontside via 53A may be formed together with the S/D contacts 90. The hard mask layer is removed after the frontside via 53A and the S/D contacts 90 are formed, and an interlayer dielectric (ILD) 92 is formed and planarized until the frontside via 53A and the S/D contacts 90 are exposed as shown in FIG. 11.

Figure 12:
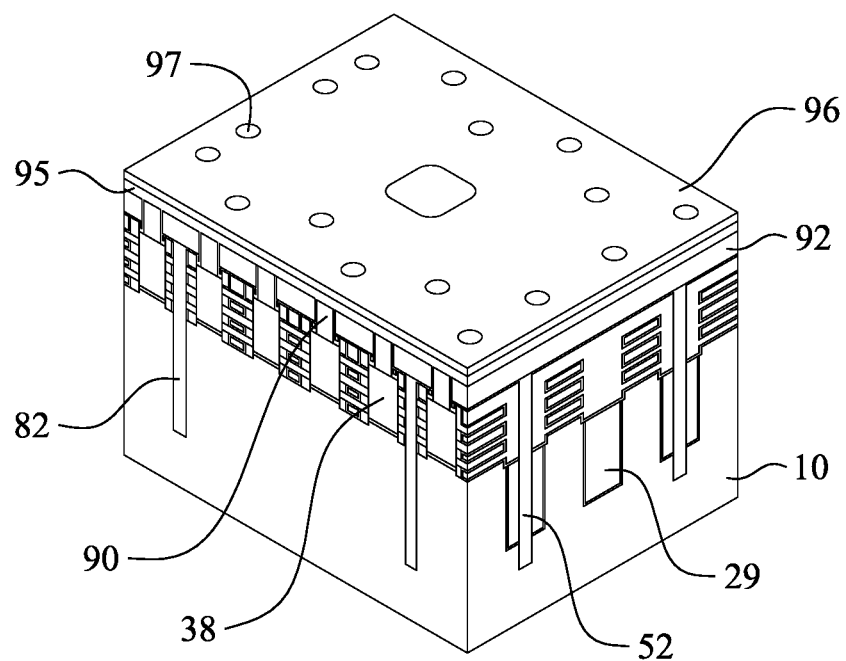
Figure 13:
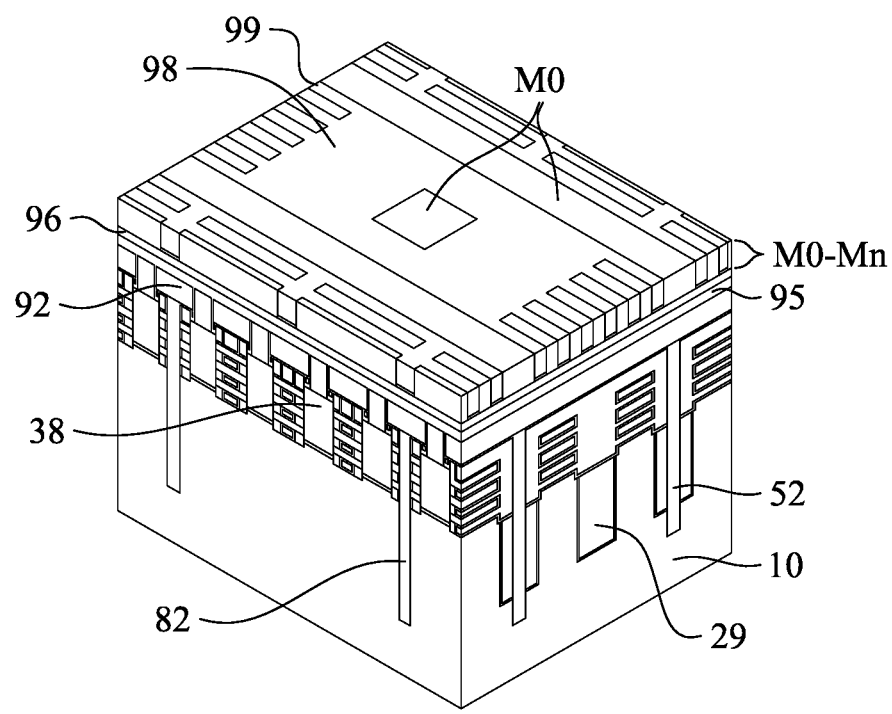

After the formation of the frontside via 53A and the S/D contacts 90, a back end of the line (BEOL) process is performed on the front side of the substrate 10 for formation of S/D contact vias. For example, an etch stop layer (ESL) 95 is formed over the ILD layer 92, and another ILD layer 96 is formed on the ESL 95. The ILD layer 96 is patterned with openings to expose the S/D contacts 90 and the frontside via 53A. The openings are then filled with conductive materials to form S/D contact vias 97 as shown in FIG. 12. The BEOL process further includes forming multiple metal layers, for example, M0 to Mn, and multiple intermetal dielectric layer (IMD) 98 between each pair of adjacent metal layers M0 to Mn. FIG. 13 shows the top metal layer M0 corresponds to the frontside via 53A and the S/D contacts 90 extending through the top IMD layer 99.

Figure 14:
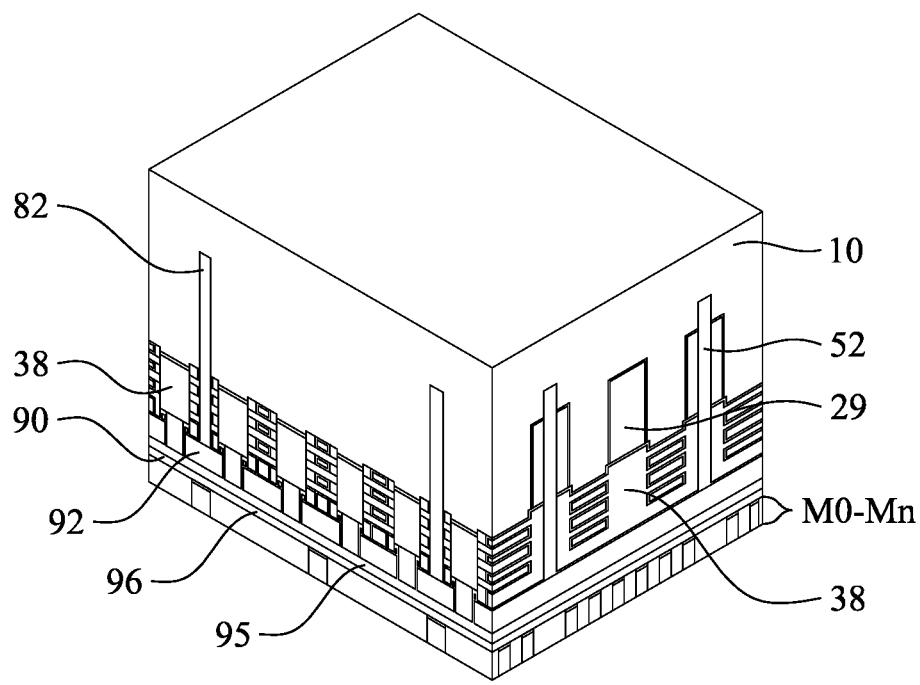
FIGS. 14 to 18 show processes for forming a backside part of the feed-through via of the semiconductor as shown in FIGS. 1-13.
Figure 15:
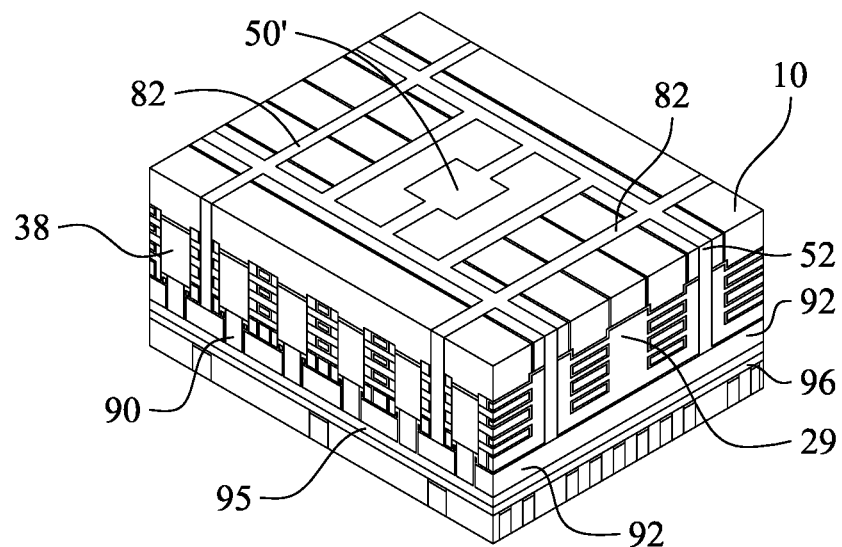

After performing BEOL process on the front side of the substrate 10, the semiconductor device is flipped with the back side of the substrate 10 placed on top as shown in FIG. 14. The back side of the substrate 10 is opposite to the front side where active regions are formed. In FIG. 14, the back side of the substrate 10 is thinned down by a planarization process, such as a chemical mechanical polishing (CMP) process. The planarization process may be performed until the bottoms of the insulation regions 52, the insulation layer 80, the insulation structures 82, and the remaining via region 50' are exposed as shown in FIG. 15.

Figure 16:
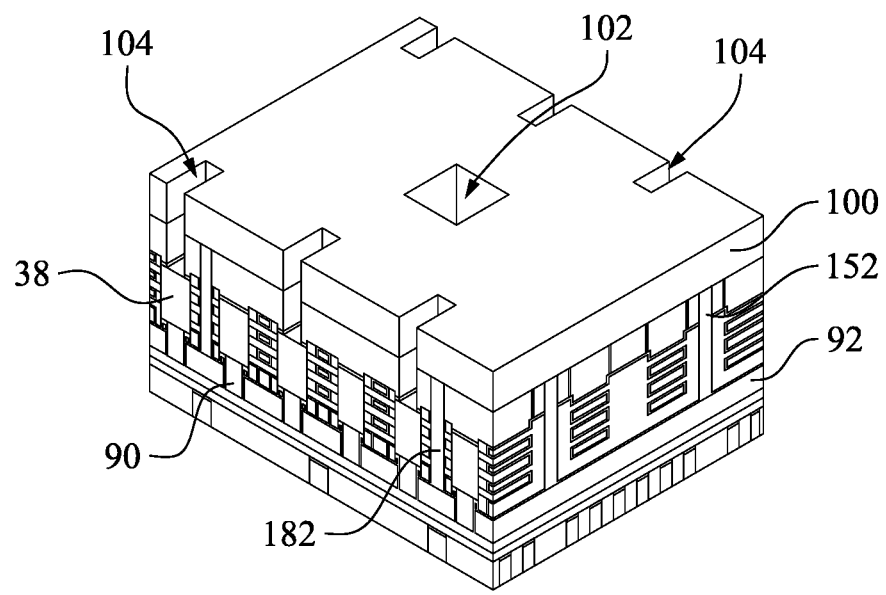

In FIG. 16, a mask layer 100 is formed over the back side of the substrate 10. The mask layer 100 is patterned to form openings 102 and 104. Materials for forming the mask layer 100 may include SiO, HfSi, SiOC, AlO, ZrSi, AlON, ZrO, HfO, TiO, ZrAlO, ZuO, TaO, YO, TaCN, SiN, SiOCN, Si, SiOCN, ZrN, SiCN, and other suitable insulation or dielectric materials. The mask layer 100 may have a thickness of about 5 nm to about 40 nm. In one embodiment, the opening 102 is aligned with the backside via 50B, and the openings 104 are aligned with the source/drain regions 38. In some embodiments, the opening 102 may extend through the mask layer 100 until the bottom of the frontside via 53A is exposed. Referring to FIGS. 16, 19A, 19B, and 20, a backside silicide layer 107 may be formed on the source/drain regions 38 exposed by the opening 104 and the surface exposed in the openings 102. Examples of materials for forming the backside silicide layer 107 may include TiSi, NiSi, TiNiSi, RuSi, and other suitable metal silicide. The thickness of the backside silicide layer 107 may range from about 1 nm to about 10 nm. A liner layer 108 (see FIGS. 19 and 20) of about 1 nm to about 5 nm conformal to the surface topography of the openings 102 and 104 may be formed. The material for forming the liner layer 94B may include SiN, SiCN, SiCO, and SiOCN.

Figure 17:
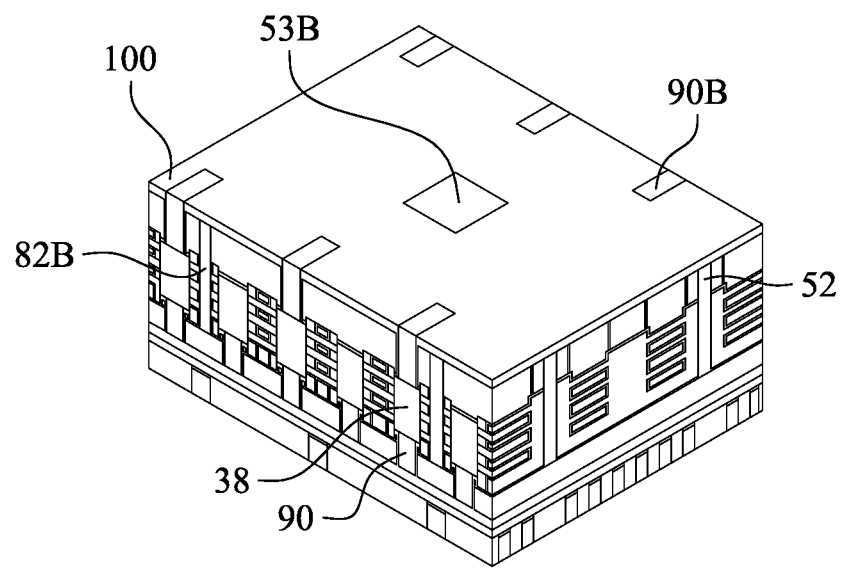
Figure 18:
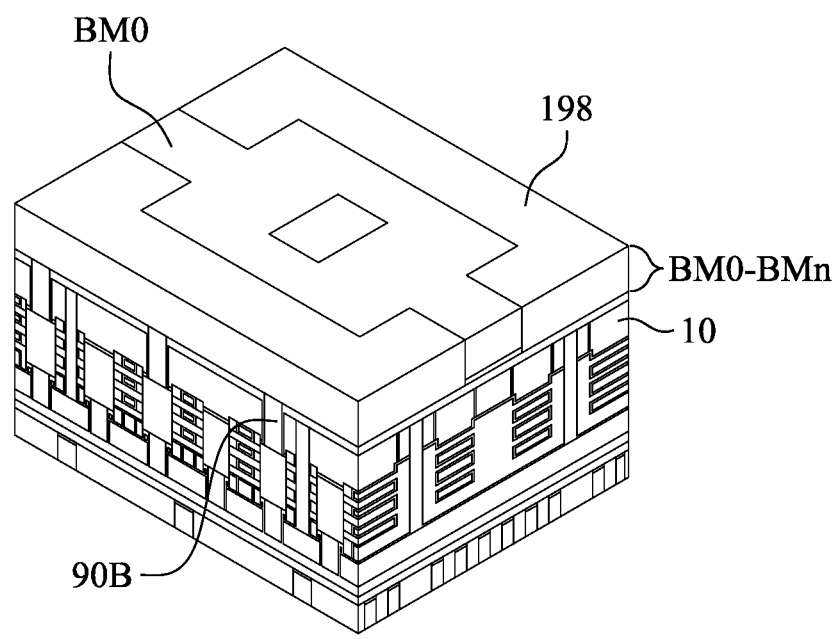

In FIG. 17, the openings 102 and 104 are then filled with conductive materials to form backside via 53B and the backside source/drain contacts 90B. In one embodiment, the conductive materials may include W, Ru, Co, Cu, Ti, TiN, Ta, TaN, Mo, Ni, and other suitable metal or metal alloys. A planarization process such a CMP is then performed to further thin down the thickness of the mask layer 100, as shown in FIG. 17. After the planarization process, a backside BEOL interconnect structureBMO-BMn is formed over the mask layer 100. The backside BEOL interconnect structure may be in the form of multiple metal layers, for example, the first metal layer BM0 to the (n+1)th metal BMn, embedded in the multiple dielectric layers 198. FIG. 18 shows a stage after formation of a first (i.e., lowermost) metal layer (BM0), in accordance with one embodiment. As show in FIG. 18, the metal layers BM0 to BMn are formed to provide electric connection paths to the backside via 53B and the bottoms of source/drain regions 38.

Figure 19:
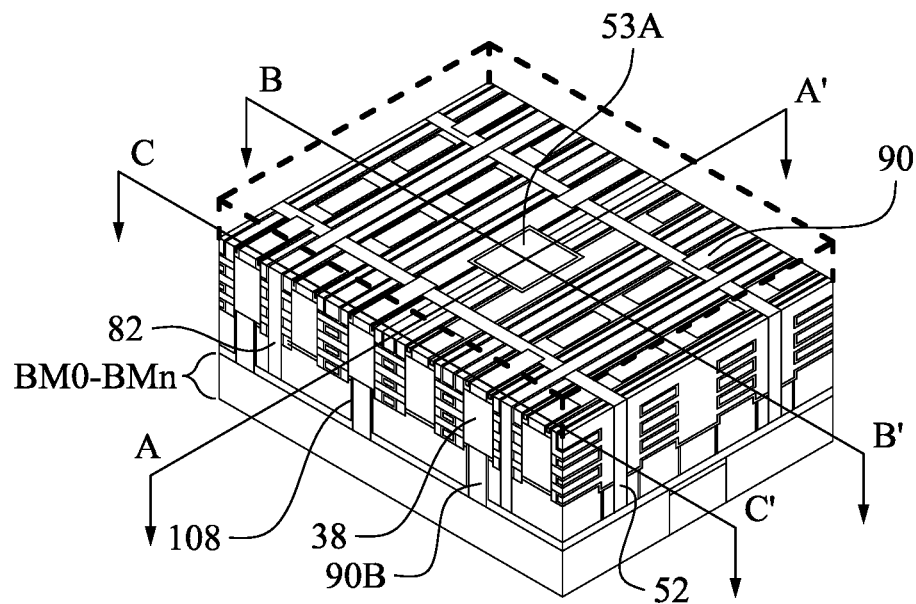
FIG. 19 is a perspective view of a semiconductor device with a feedthrough via.
Figure 19A:
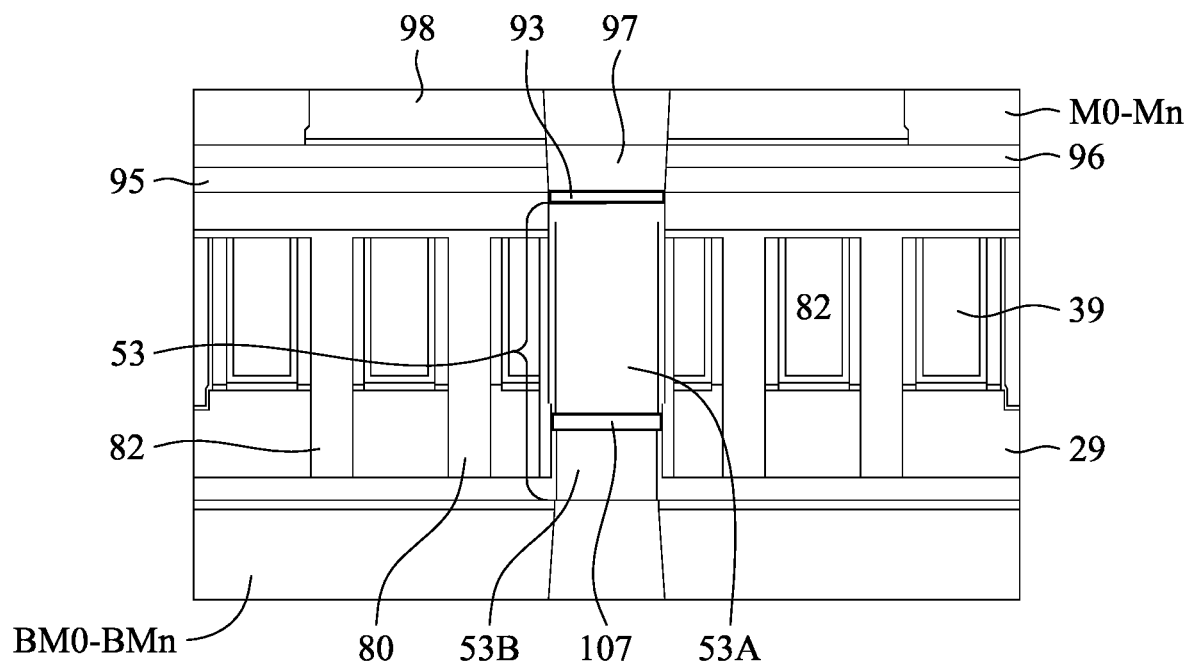
FIGS. 19A and 19B are cross-sectional views cutting along lines A-A' and B-B'.
Figure 19B:
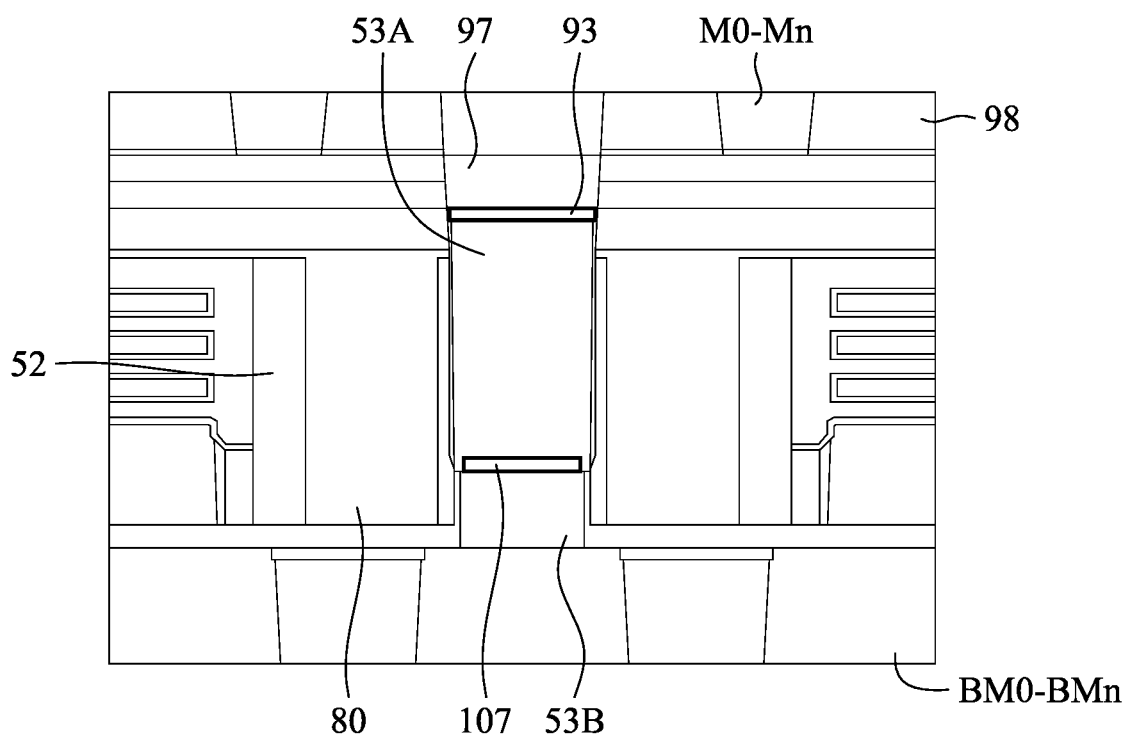
Figure 20:
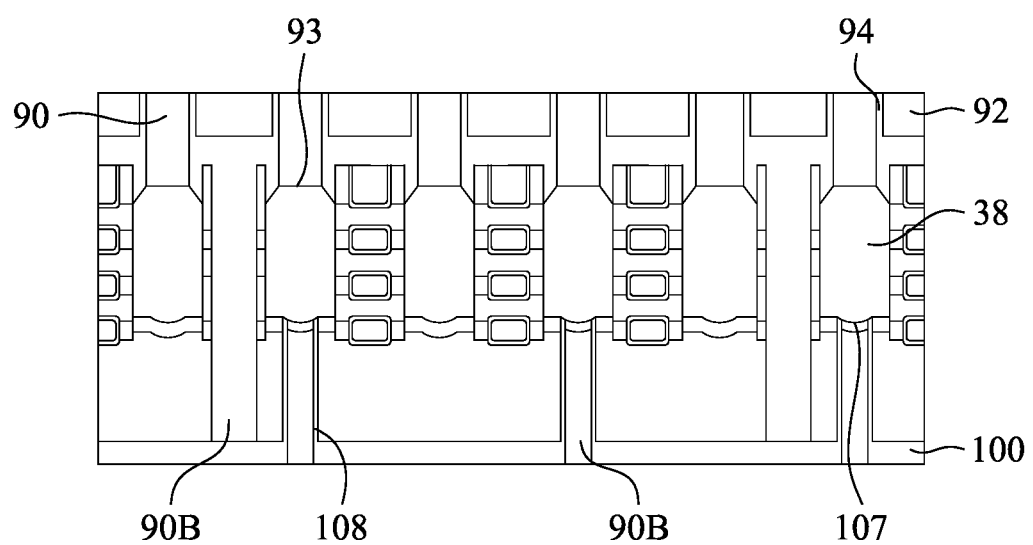
FIG. 20 is a cross-sectional view cutting along line C-C' of the FIG. 19.
Figure 21:
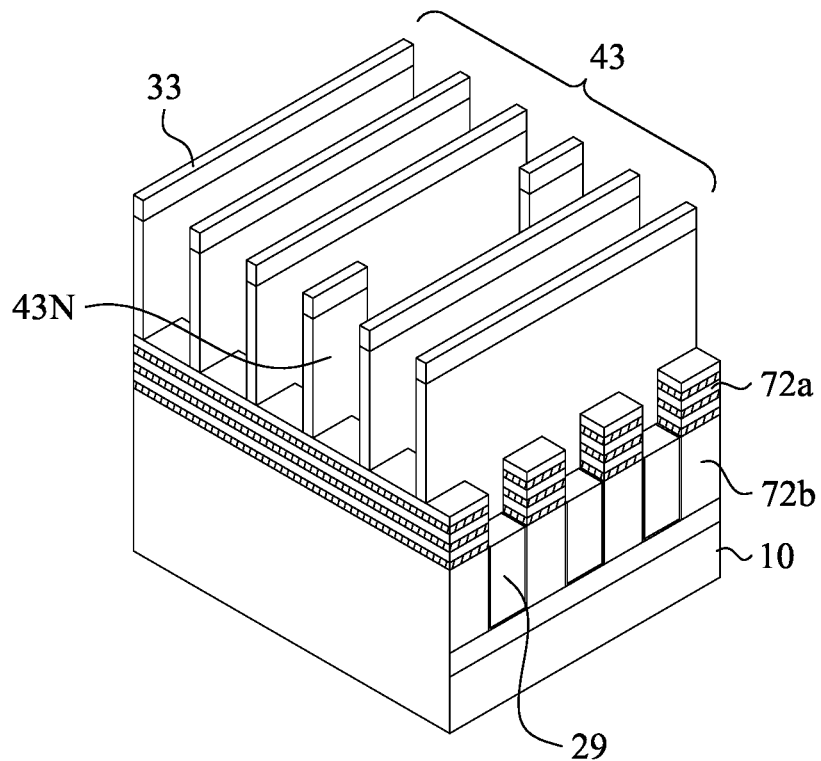
FIGS. 21-29 show a part of the processes for forming the feedthrough via according to another embodiment.

FIG. 19 is a perspective view of a FET device with the front side on top. FIG. 19A is a cross-sectional view cutting along the line A-A' of FIG. 19 and FIG. 19B is a cross-sectional view cutting along the line B-B' of FIG. 19. In FIG. 19, the metallization layer (for example, the multiple metal layers M0-Mn embedded in multiple IMD layers 98 such as those as shown in FIG. 13), the ILD layer (for example, 96 in FIG. 13), and the etch stop layer (for example, the ESL layer 95 in FIG. 13) are formed in the position defined by the dash lines. A feed-through via 53 comprising the frontside via 53A and the backside via 53B is formed to extending through the substrate 10 to establish electric connection from the outermost metal layer M0 at the front side to the outermost metal layer M0 at the back side. In one embodiment, the overall height of the feed-through via may be around 40 nm to about 200 nm. FIG. 20 shows the cross-sectional line C-C' of FIG. 19 (the BEOL metallization structures at both the front side and the back side have been omitted).

FIGS. 21-29 show an embodiment in which one of the metal gates 43 has been patterned into two separate parts while the stack of metal gates 40 is formed. In this embodiment, the cell region 70 to be defined by the insulation regions 52 and the trenches 60 may be predetermined Except for the metal gate with nature end 43N and the mask used to remove the floating gates within the cell region, the operations and processes for forming the feed-through via are the same as the embodiment as shown in FIGS. 1-20. Therefore, same reference numerals have been used for the corresponding features in FIG. 21-29. Detailed description of the same processes for forming the feed-through via 53 will not be repeated here.

Figure 22:
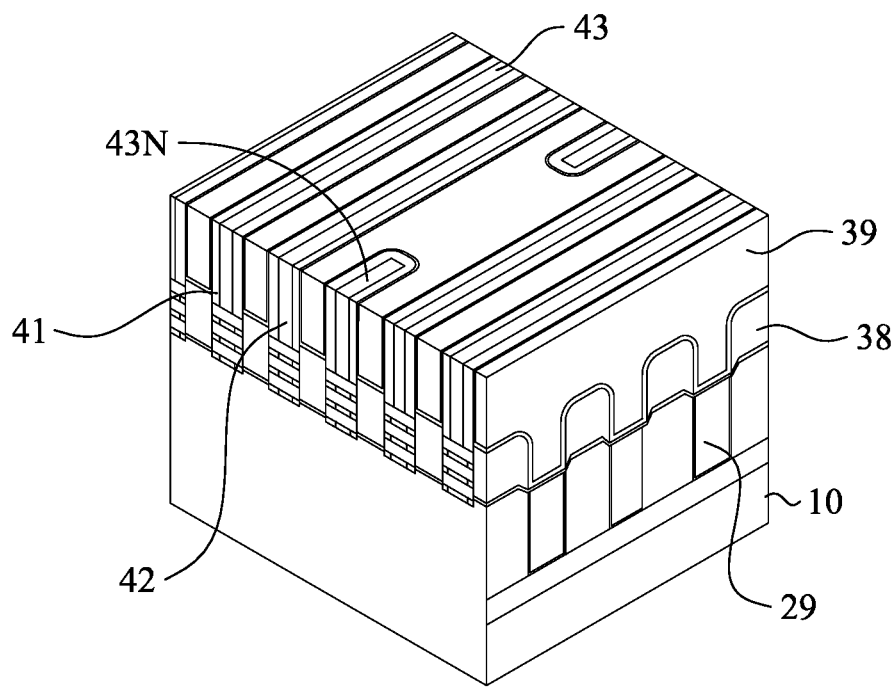
Figure 23:
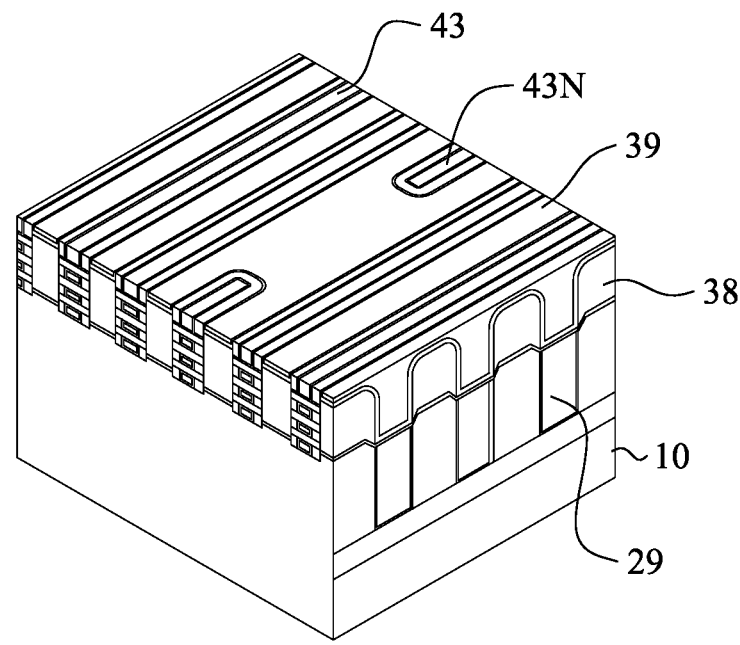
Figure 24:
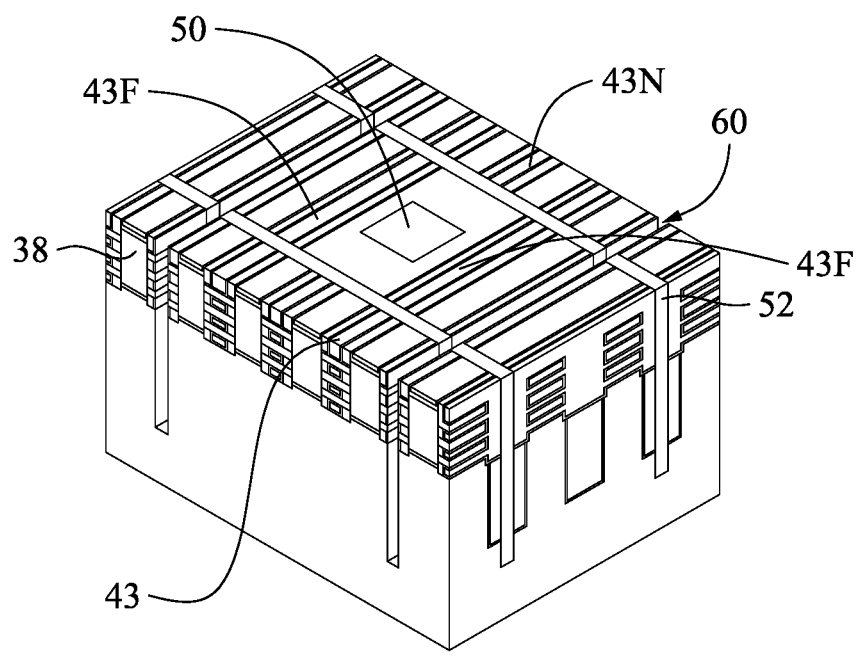
Figure 25:
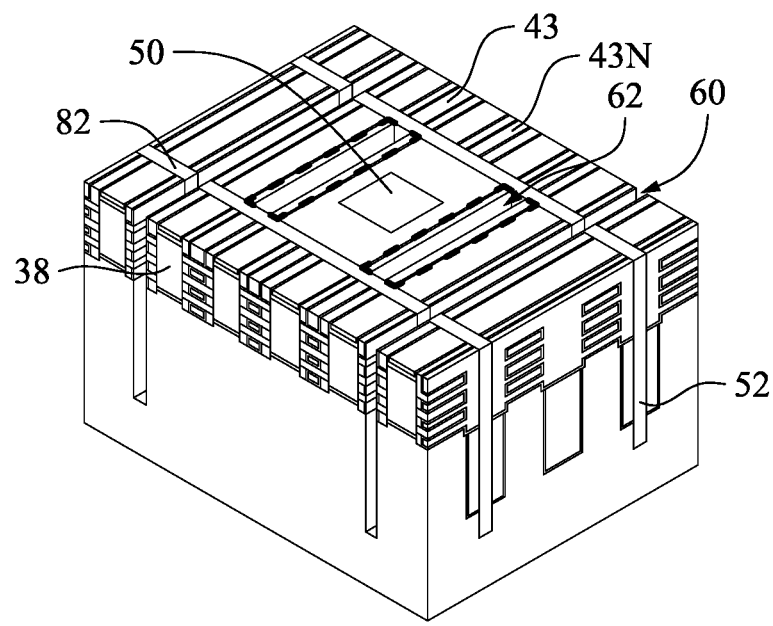
Figure 26:
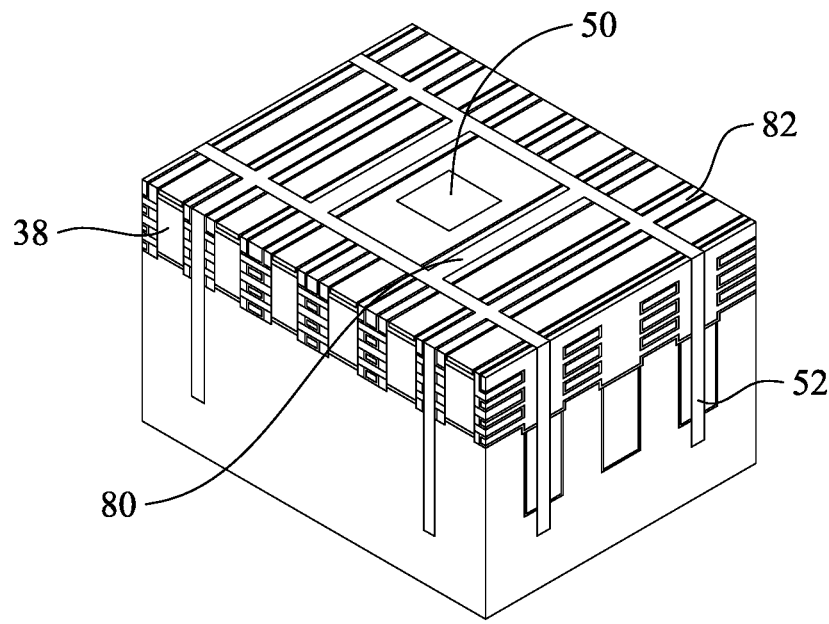
Figure 27:
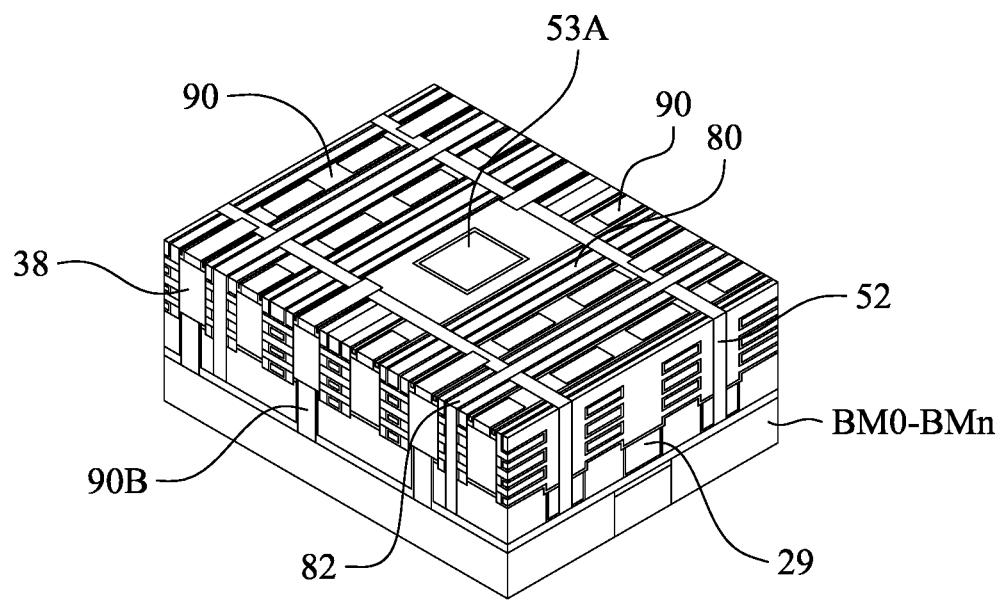
Figure 28:
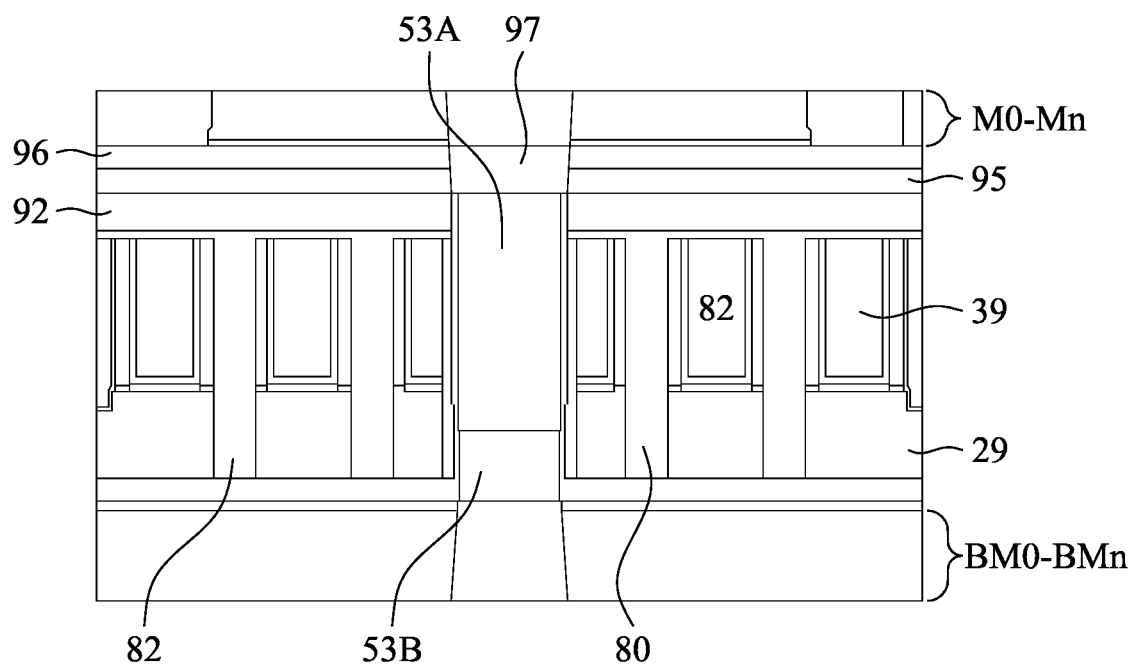
Figure 29:
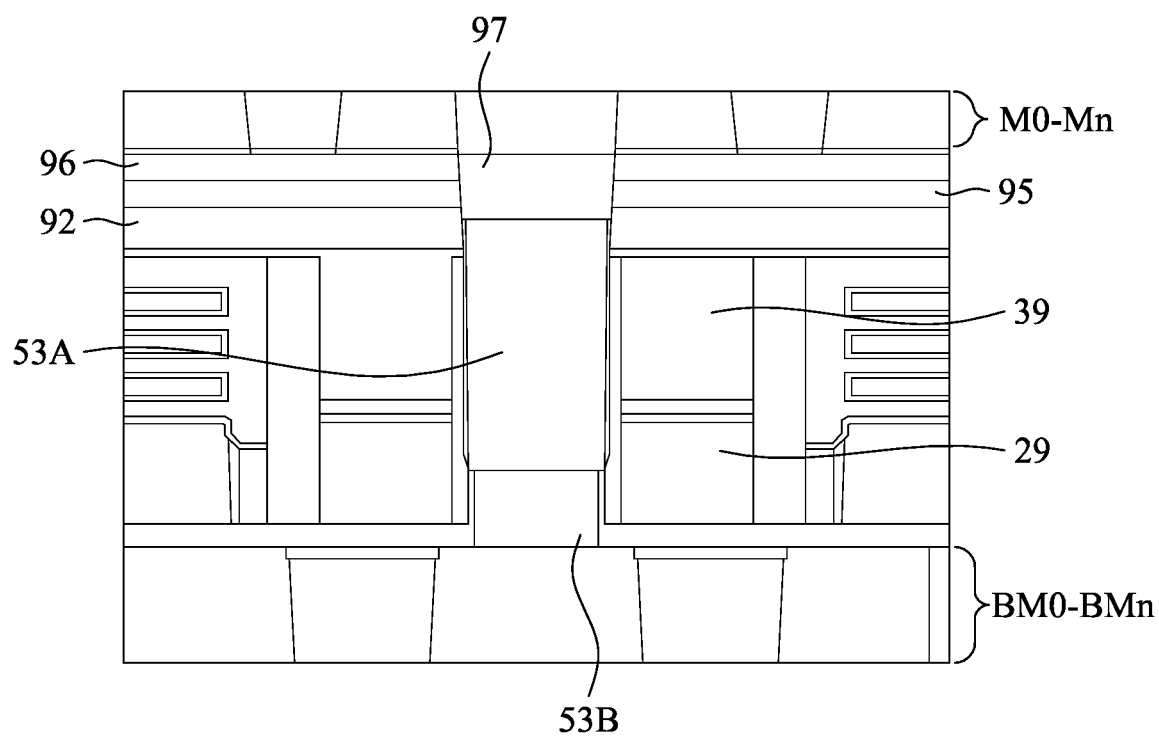

FIG. 22 shows the formation of the epitaxial S/D region 38 and the ILD layer 39. FIG. 23 shows the thinned down structure. In FIG. 24, the insulation region 52 and the trenches 60 to define the cell region, and the via region 50 within the cell region are formed. As the central portion of the nature-end metal gate 43N within the cell region has been removed, only two floating gates 43F remain in the cell region in the current embodiment. As shown in FIG. 25, a mask indicated by the dash line includes only two openings is used for removing the floating gates 43F. The openings 62 created by removing the floating gates 43F and the trenches 60 are then filled with insulation materials to form insulation layers 80 and 82, respectively. In FIG. 27, the frontside via 53A and the frontside S/D contacts 90 are formed. The backside via (53B as shown in FIGS. 26 and 27) and the backside S/D contacts 90B are also formed. FIGS. 28 and 29 shows the cross-sectional views corresponding to FIGS. 19A and 19B, respectively. The cross section as shown in FIG. 28 appears similar to the cross section as shown in FIG. 19A which shows the FET that is formed without formation of a nature-end metal gate when the isolated cell region may be predefined or predetermined. However, as shown in the cross section in FIG. 29, as the metal gate has been patterned with the nature end, the position where the metal gate has been removed is filled with the ILD 29 and ILD 39. Therefore, the frontside via 53A is surrounded with the ILD layer 39 and ILD layers 29 instead of the insulation layer 80 as shown in FIG. 19B.

The disclosure provides a semiconductor device. The semiconductor device has a stack of parallel metal gates formed on a first side of a substrate, a first pair of insulation regions extending across the stack of parallel metal gates, a second pair of insulation regions replacing two of the parallel metal gates, a first isolated region enclosed by the first and second pairs of insulation layers, a first via formed within the isolated region, and an insulation layer replacing the metal gates located within the isolated region. Three or more metal gates are located within the isolated region, and the first via extends through a portion of a center one of the three metal gates within the isolated region.

The first pair of insulation regions may be formed of materials selected from at least one of SiO, SiOC, AlO, AlON, ZrO, HfO, TiO, ZrAlO, ZnO, SiOCN, SiOCN, and SiCN. The second pair of insulation regions may be formed of SiCO, SiO, and SiOCN for forming the second pair of insulation regions. The first via may be formed with materials selected from at least one of W, Ru, Co, Cu, Ti, TiN, Ta, TaN, Mo, and Ni. The first via may have a top dimension of about 30 nm to about 100 nm, a bottom dimension of about 25 nm to about 90 nm, and a height of about 20 nm to about 100 nm.

The semiconductor device may further comprise a third pair of insulation regions on a second side the substrate and aligned with the first pair of insulation regions and a fourth pair of insulation regions on the second side of the substrate and aligned with the second pair of insulation regions. The third pair of insulation regions and the fourth pair of insulation regions defining a second isolated cell region at the second side of the substrate. The semiconductor device further includes a second via within the second isolated cell region at the second side of the substrate and connected with the second via with the first via to form a feed-through via.

The second isolated cell region may be aligned with the first isolated cell region. A silicide layer may be formed on a bottom side of the first via and the second via is formed on the silicide layer. The second via may have a top dimension of about 30 nm to about 100 nm, a bottom dimension of about 25 nm to about 90 nm, and a height of about 20 nm to about 100 nm.

A semiconductor device is provided. The semiconductor includes a feed-through via extending from a first side of a substrate to a second side of the substrate, a first pair of insulation regions extending around the via along a direction perpendicular to a stack of metal gates formed on the first side of the substrate, and a second pair of insulation regions extending around the via along a direction parallel with the metal gates. The semiconductor device also includes a dielectric layer which fills a space created by removing the metal gates located between the feed-through via, the first pair of insulation regions, and second pair of insulation regions. The feed-through via includes a frontside via formed at the first side of substrate connected with a backside via formed at the second side of the substrate.

A method of manufacturing a semiconductor device is provided. A field effective transistor (FET) device is formed on a first side of a substrate. A cell region isolated from other regions of the FET device is defined. Metal gates located within the isolated cell region are removed and refilling and refilled with interlayer dielectric oxide material. A via to extend through the isolated cell region and a plurality of S/D contacts to contact with a plurality of source/drain regions are formed on the first side of the substrate.

The cell region is defined by forming a first pair of insulation regions extending through a stack of the metal gates and a second pair of insulation region by removing two of the stack of metal gates. The feed-through via is formed by forming frontside via extending through the isolated cell region and a backside via extending from the second side of the substrate to connect with the front side via. A plurality of source/drain contacts may be formed at both the first side and the second side to contact with a plurality of source/drain regions formed on the first side of the substrate from both the first side and the second side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a stack of parallel metal gates formed on a first side of a substrate;
   a first pair of insulation regions extending across the stack of parallel metal gates;
   a second pair of insulation regions replacing two of the parallel metal gates, wherein three or more metal gates are located between the second pair of insulation regions;
   a first isolated region enclosed by the first and second pairs of insulation regions;
   a first via formed within the first isolated region, wherein the first via extends through a portion of a center of the three metal gates within the first isolated region; and
   an insulation layer replacing the three metal gates located within the first isolated region.

2. The semiconductor device according to claim 1, wherein the first pair of insulation regions are made of materials selected from at least one of SiO, SiOC, AIO, AION, ZrO, HfO, TiO, ZrAIO, ZnO, SiOCN, SiOCN, and SiCN.

3. The semiconductor device according to claim 1, wherein the second pair of insulation regions are made of at least one of SiCO, SiO, and SiOCN.

4. The semiconductor device according to claim 1, wherein the first via extends beyond the middle of the three metal gates within the first isolated region in a direction along which the first pair of insulation region extends.

5. The semiconductor device according to claim 1, wherein the first via is made of materials selected from at least one of W, Ru, Co, Cu, Ti, TIN, Ta, TaN, Mo, and Ni.

6. The semiconductor device according to claim 1, wherein the first via has a top dimension of about 30 nm to about 100 nm and a bottom dimension of about 25 nm to about 90 nm.

7. The semiconductor device according to claim 1, wherein the first via has a height of about 20 nm to about 100 nm.

8. The semiconductor device according to claim 1, further comprising:
   a third pair of insulation regions on a second side of the substrate, the second side being opposite to the first side and the third pair of insulation regions being aligned with the first pair of insulation regions;
   a fourth pair of insulation regions on the second side of the substrate, the fourth pair of insulation regions being aligned with the second pair of insulation regions; and
   a second via within a second isolated region enclosed by the third and fourth pair of insulation regions, the second via being connected to the first via to form a feedthrough via.

9. The semiconductor device according to claim 8, wherein the second via is made of materials selected from at least one of W, Ru, Co, Cu, Ti, TIN, Ta, TaN, Mo, and Ni.

10. The semiconductor device according to claim 8, wherein the second via has a top dimension of about 30 nm to about 100 nm.

11. The semiconductor device according to claim 8, wherein the second via has a bottom dimension of about 25 nm to about 90 nm.

12. The semiconductor according to claim 8, wherein the second via has a height of about 20 nm to about 100 nm.

13. A semiconductor device, comprising:
a feedthrough via extending from a first side of a substrate to a second side of the substrate;
a first pair of insulation regions extending around the feedthrough via along a direction perpendicular to a stack of metal gates formed on the first side of the substrate;
a second pair of insulation regions formed by replacing two of the stack of metal gates, wherein the feedthrough via is formed between the second pair of insulation regions; and
a dielectric layer filling a space between the feedthrough via, the first pair of insulation regions, and second pair of insulation regions.

14. The semiconductor according to claim 13, wherein the feedthrough via includes a frontside via formed at the first side of substrate connected with a backside via formed at the second side of the substrate.

15. A method of manufacturing a semiconductor device, comprising:
forming a field effective transistor (FET) device on a first side of a substrate;
defining a cell region isolated from other regions of the FET device;
removing metal gates located within the isolated cell region and refilling openings created by removing the metal gates with interlayer dielectric oxide material; and
forming a feedthrough via within the isolated cell region and extending through the substrate.

16. The method according to claim 15, further comprising:
forming a first pair of insulation regions extending through a stack of the metal gates and a second pair of insulation region by removing two of the stack of metal gates and refilling with dielectric material to define the isolated cell region.

17. The method according to claim 15, further comprising:
using a first CPODE mask for forming the second pair of insulation regions and a second CPODE mask for removing the metal gates within the isolated cell region.

18. The method according to claim 15, wherein the isolated cell region includes at least three metal gates therewithin.

19. The method according to claim 15, further comprising:
forming a plurality of source/drain contacts at both the first side and a second side of the substrate opposite to the first side, to contact with a plurality of source/drain regions formed on the first side of the substrate from both the first side and the second side of the substrate.

20. The method according to claim 15, further comprising:
forming a frontside via extending through the isolated cell region and a backside via extending from the second side of the substrate to connect with the frontside via.

* * * * *